United States Patent [19]

Satoh et al.

[11] Patent Number: 4,673,772

[45] Date of Patent: Jun. 16, 1987

[54] ELECTRONIC CIRCUIT DEVICE AND METHOD OF PRODUCING THE SAME

[75] Inventors: Ryohei Satoh; Muneo Oshima; Minoru Tanaka, all of Yokohama; Suguru Sakaguchi, Chigasaki; Akira Murata, Tokyo; Kazuo Hirota, Chigasaki, all of Japan

[73] Assignee: Hitachi, Ltd., Tokyo, Japan

[21] Appl. No.: 784,035

[22] Filed: Oct. 4, 1985

[30] Foreign Application Priority Data

Oct. 5, 1984 [JP] Japan .................................. 59-208072

[51] Int. Cl.$^4$ ............................................. H01L 23/14
[52] U.S. Cl. .................................. 174/52 FP; 29/840; 228/180.2; 228/185; 357/67
[58] Field of Search ............... 174/52 FP; 357/66, 67; 29/831, 840; 361/400; 228/56.3, 180.2, 189, 170, 185

[56] References Cited

U.S. PATENT DOCUMENTS 3,871,014  3/1975  King et al. ............................ 357/67
3,871,015  3/1975  Lin et al. ....................... 228/180.2 X
4,604,644  8/1986  Beckham et al. ................. 29/840 X

Primary Examiner—Arthur T. Grimley
Assistant Examiner—D. A. Tone
Attorney, Agent, or Firm—Antonelli, Terry & Wands

[57] ABSTRACT

In connecting an electronic circuit part such as a semiconductor or other part to a substrate for mounting the part with solder, the solder is composed of a high-melting-point solder portion which is subjected to working such as rolling and heat treatment in order to break the cast structure thereof, and a smaller volume of low-melting-point solder portions. The high-melting-point solder portion is connected to both the electronic circuit substrate and the electronic circuit part through the low-point-melting solder portions.

This method enables interconnection between objects to be connected without impairing the high ductility and toughness of the high-melting-point solder which is subjected to working and heat treatment. This soldering method ensures highly reliable manufacture of miniaturized high density circuits, such as LSI.

12 Claims, 21 Drawing Figures

ELECTRONIC CIRCUIT DEVICE AND METHOD OF PRODUCING THE SAME

BACKGROUND OF THE INVENTION

This invention relates to an electronic circuit device and a method of producing the same which improves the reliability of the joints between an electronic circuit part such as a semiconductor chip or a part and a circuit substrate, by mechanical or thermo-mechanical treatment solder with high-melting-point solder (or wrought solder), the solder being subjected to a process which will be described later, and heat treatment.

Figure 1:
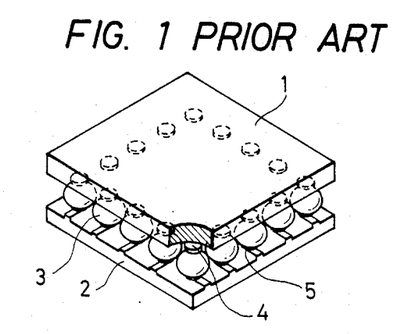
FIG. 1 is a perspective view of a conventional electronic circuit device.

In the field of electronic circuit devices, so called "surface mounting" methods have been adopted in order to protect semiconductors or parts mechanically and chemically and to improve the productivity and reliability of electronic circuit devices. Among these, a method of connecting a semiconductor chip 1 and the peripheral end surface of a substrate 2 which faces the semiconductor 1 by minute solder 3 through electrodes 4 and 5, as shown in FIG. 1, is known as the mounting method with the highest density (cf. U.S. Pat. No. 3,871,014, or Japanese Patent Publication No. 28735/1968). In these methods, the chip 1 and the circuit substrate 2 are connected using the effect of the wetting and diffusion of the completely melted solder 3 with respect to the electrodes 4 and 5. Since it is necessary to melt the solder completely, segregation of the alloy structure, defects, and residual stress disadvantageously often result during the cooling stage of the solder, so that the solder 3 has a cast structure with low elongation. The solder 3 which have these cast structures have low elongation with respect to external force, producing nonuniform deformation, which leads to the serious problem of the solder 3 being fractured by various kinds of stresses produced during use in a comparatively short period of time due to metal fatigue of the solder 3.

Such a problem of soldering interconnection has become more important with the increasing tendency towards miniaturization of electronic parts and increase in mounting density as in the case of LSI.

SUMMARY OF THE INVENTION

Accordingly, it is an object of the invention to solve the above-described problem and to provide an electronic circuit device which enables highly reliable solder connections, together with a method of manufacturing the same.

To achieve this aim, this invention is characterized in that the ductility of solder is greatly improved by subjecting it to rolling and to heat treatment, and in that the wrought solder which is formed into the shape corresponding to the joints is connected with low-melting-point solder joints which are supplied between parts such as a semiconductor chip and a substrate by local welding at such a low temperature as not to melt the wrought solder, thereby utilizing the ductility and toughness of the wrought solder.

In addition, this invention provides a means for realizing solder connections in the present invention which will enable mass production of high density electronic circuit devices.

DESCRIPTION OF THE PREFERRED EMBODIMENTS

Wrought solder is used in the present invention for the connecting joints between a part and a substrate on the basis of the following phenomenon and principle. Many metals have problems such as gas occlusions and defects when they are melted and solidified, and most alloys form heterogeneous cast structures including crystal segregation and gravity segregation in the solidifying stage. Since such metals and alloys having defects and heterogeneous cast structures are generally brittle and hard, when they are used as structural members, the cast structures are broken by rolling or heat treatment into homogeneous structures in order to improve the toughness and the ductility. However, since solder joints of alloys such as Pb - Sn or Au - Sn are based on melting connection, such solder joints inevitably have cast structures by melting and solidifying, and it is almost impossible to break the cast structure by rolling or heat treatment unlike the above-described case. Therefore, there is no alternative but to use the hard and brittle cast structure without any treatment.

Figure 2:
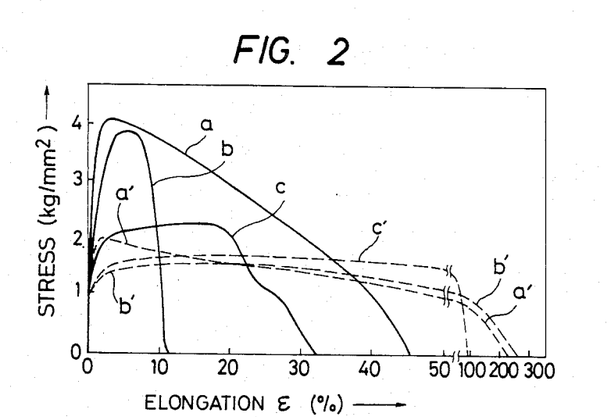
FIG. 2 shows the characteristic curves of tensile strength in wrought solder according to the invention and solder in the prior art, respectively.

FIG. 2 shows the tension properties of wrought solder pieces a', b', and c' and cast solder pieces a, b, and c, using Pb - Sn alloys as materials. The ordinate denotes the stress (Kg/mm$^2$) and the abscissa the elongation $\epsilon$ (%).

Figure 3A:
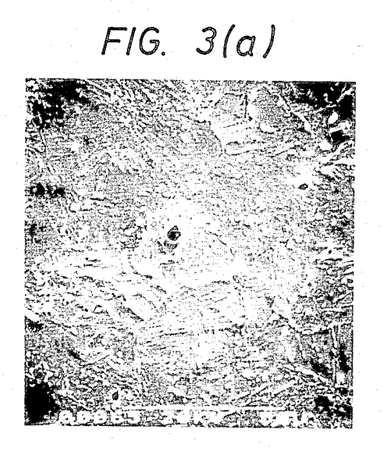
FIGS. 3(a) and 3(b) are photos of the structures of the wrought solder according to the invention and a conventional casting solder.
Figure 3B:
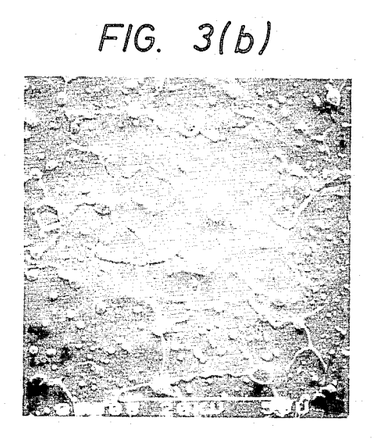

As is obvious from the Figure, all the wrought solder pieces of any composition a', b', and c' are soft and exhibit improvement in elongation. These wrought solder pieces a', b' and c' are formed by making test pieces for a tension test of a sheet which has been prepared by cold rolling at a draft of 90% and subjecting the test pieces to heat treatment at room temperature for about one week. FIG. 3 shows the comparison of the structure of the cast solder piece (as shown in FIG. 3(a), and c in FIG. 2) of 95Pb /5 Sn with that of the wrought solder piece (as shown in FIG. 3(b), and c' in FIG. 2). As shown in FIGS. 3(a) and 3(b), in the structure of the wrought solder piece (as shown in FIG. 3(b)) the grains are finer and the segregated Sn phase of high concentration is spheroidized like spheroidal graphite cast iron and the internal strain is less in comparison with the structure of the cast solder piece (as shown in FIG. 3(a)). The expansion of the wrought solder piece c' is three times or four times as great as that of the cast solder piece c, as is shown in FIG. 2, which fact shows the effects of working and heat treatment on improving the properties of the metal.

Figure 4:
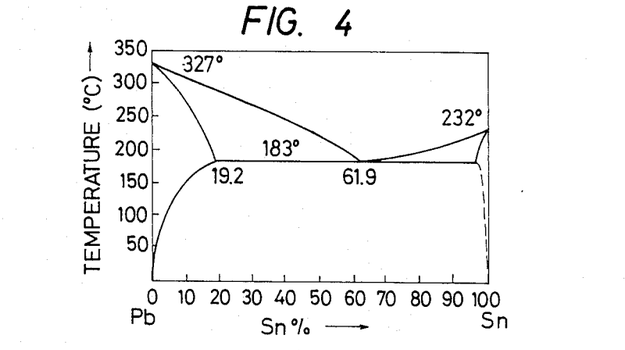
FIG. 4 is a phase diagram of a Pb - Sn alloy according to the invention.
Figure 5:
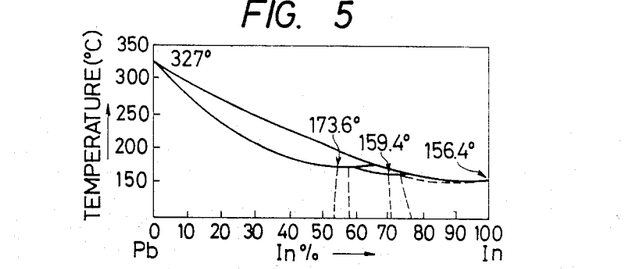
FIG. 5 is a phase diagram of a Pb - In alloy.
Figure 6:
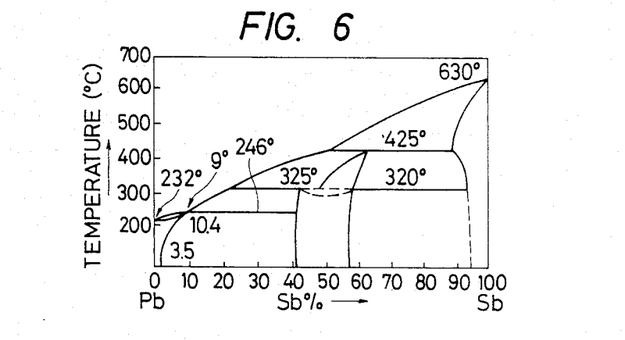
FIG. 6 is a phase diagram of a Pb - Sb alloy.

The inventors have developed an idea from the above-described phenomenon that a joint, which can sufficiently withstand fatigue and the like caused from various stresses, can be obtained by using the above-described wrought solder. In other words, the desired connection is carried out without losing the tenacity and ductility of wrought solder by melting only the end connecting portion of the wrought solder joint with solder of a lower-melting point than the wrought solder, thereby ensuring a connection of high reliability. In addition, these effects can be expected from almost all solders. FIGS. 4, 5, and 6 are phase diagrams of a Pb - Sn alloy, a Pb - In alloy, and a Pb - Sb alloy, respectively, disclosed by M. Hansen in 1958. As is clear from these Figures, all of the alloys show segregation and heterogeneous structures during the cooling and solidifying stage, and improvement in expansion by working and heat treatment can be expected.

Figure 7:
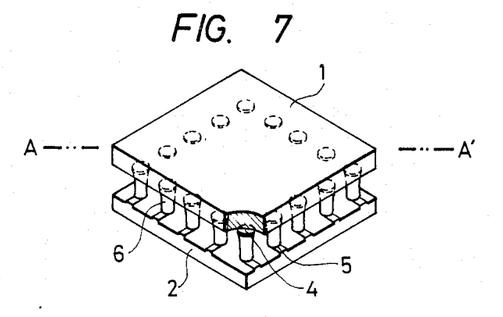
FIG. 7 is a perspective view of an embodiment of an electronic circuit device according to the invention.
Figure 8:
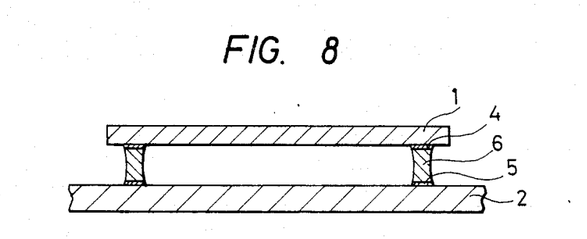
FIG. 8 is a sectional view of the embodiment shown in FIG. 7, taken along the line A—A'.

Hereinunder an embodiment of the invention will be explained with reference to FIGS. 7 to 9. FIG. 7 is a perspective view of an electronic circuit device having a connecting structure in accordance with the invention, and FIG. 8 is a sectional view of the embodiment taken along the line A—A'. As shown in the FIGS. 7 and 8, wrought solder elements 6 which are worked and shaped are inserted between the semiconductor chip 1 and the substrate 2 through the electrodes 4 and 5. Solder (not shown) of a lower-melting point than the wrought solder is attached to the electrodes 4 and 5, so that the semiconductor chip 1 and the substrate 2 are connected by melting only this attached solder.

Figure 9A:
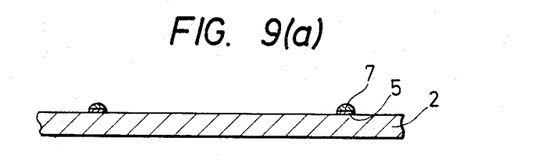
FIGS. 9(a) to 9(d) are explanatory sectional views of the manufacturing steps of the electronic circuit device shown in FIG. 7.
Figure 9B:
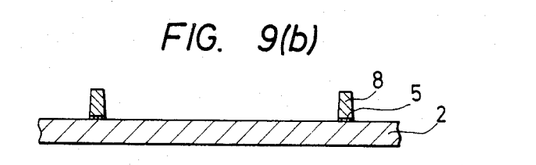
Figure 9C:
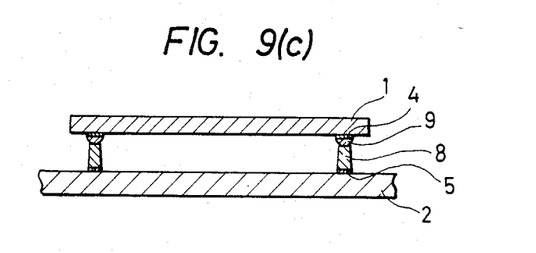
Figure 9D:
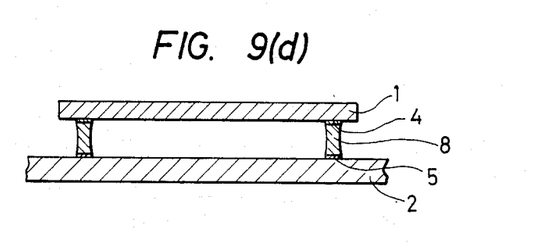

A method of manufacturing the embodiment will next be described with reference to FIGS. 9(a) to 9(d). The substrate 2 may be made of various materials and the electrodes 5 are provided on the substrate 2 by a method suitable to the particular substrate material. For example, if the substrate 2 is made of alumina ceramic, the electrodes 5 are formed by printing conductor paste such as Ag - Pd or W and sintering it. When the conductor paste is W, Ni plating is conducted. Eutectic solder joints 7 of a low-melting point such as solder of Pb - Sn or An - Sn are formed on the electrodes 5 by reflow after solder pasting, solder balls, reflow after vacuum deposition, or solder dipping. Thus the circuit substrate 2 is formed. Low-melting-point solder elements 9 are formed on the electrodes 4 of the semiconductor chip 1 in a similar way to the solder 7. High-melting-point wrought solder joints 8 are next formed into a shape corresponding to the electrode 5, for example, circle, square, or triangle, as is shown in FIG. 9(b). The shape of the wrought solder 8 does not necessarily correspond to the shape of the electrode 5. The composition of the wrought solder 8 is, for example, 95 wt % Pb and 5 wt % Sn, or 80 wt % Au and 20 wt % Sn. The wrought solder 8 here is formed by rolling a dissolved and cast material into a sheet at a draft of 90%, and thereafter subjecting it to heat treatment in an inert atmosphere at a temperature of 50° C. for two days. The wrought solder joints 8 are placed on the circuit substrate 2 at the same position as the low-melting point solder 7. The substrate 2 is heated in this state such that only the low-melting point solder 7 is melted in order to fix the wrought solder 8 on the electrodes 5. The tension properties of this solder 8 substantially agree with those of the solder piece c' as shown in FIG. 2. The semiconductor chip 1 is then placed on the wought solder 8 in such a manner that the low-melting point solder elements 9 are at the same positions as the relevant wrought solder 8, and are heated at a temperature slightly higher than the melting point of the low-melting point solder 7, thereby being connected to the upper portions of the wrought solder 8. Thus the electronic circuit device shown in FIG. 9(d) can be obtained. In this embodiment, the wrought solder 8 is columnar 0.15 mm in diameter and 0.3 mm in length. The wrought solder 8 is supplied to the circuit substrate using a stainless steel mask with holes formed thereon in accordance with the pattern of the electrodes 5. The soldering joints obtained in this way essentially consist of the wrought solder, because, since the melting point of the wrought solder is high and its volume is large, the area of the wrought solder 8 which is connected by melting with the low-melting-point solder 7 is so small, from 20 to 30 $\mu m^2$. When the life of the wrought solder 8 was evaluated in one cycle/hr test at a temperature cycle of $-55°$ to $+150°$ C., it was five times as long as a conventional cast solder in case of 95 Pb-5 Sn solder and twice as long as a conventional cast solder in case of 80 Au - 20 Sn solder.

Figure 10:
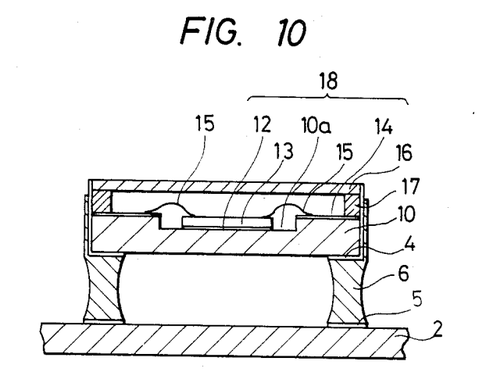
FIG. 10 is a sectional view of a ceramic package, which is another embodiment of the invention.
Figure 11:
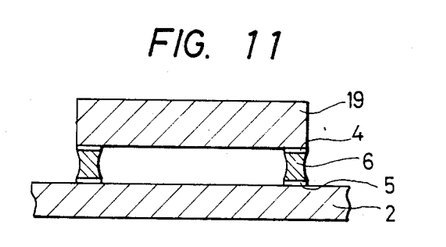
FIG. 11 is a sectional view of a surface mounting part of a resistor.

The present invention may be applied by a similar method to a surface mounting part of a ceramic-packaged IC, a condenser, a resistor or the like. For example, this invention can be applied to a connection between a ceramic package 18 and the substrate 2 through the electrodes 4 and 5 with solder 6, as is shown in FIG. 10. The ceramic package 18 is composed of a metallic layer 12 of a molybdenum - manganese layer which is placed on the central portion of a recessed portion 10a of a ceramic substrate 10 provided for receiving an element, the molybdenum - manganese layer being subjected to nickel plating and gold plating; a semiconductor element 13 which is placed on the metallic layer 12; an internal lead 14 formed by plating the ceramic substrate 13 except for the recessed portion 10a with a molybdenum - manganese layer; wires 15 used for wire bonding for the purpose of connecting the internal lead 14 with the semiconductor element 13; and a sealing portion 17 for sealing between a the ceramic substrate 10 and a sealing cover 16 provided above the ceramic substrate 10. This invention is also applicable to connection with the solder 6 between the substrate 2 and a condenser or a resistor 19 through the electrodes 4 and 5, as is shown in FIG. 11. As a result of measurement of the life of the wrought solder 6 in this case, carried out in order to determine the resistance to metal fatigue, the solder 6 showed three to five times longer life than that of a conventional cast solder joint.

Figure 12A:
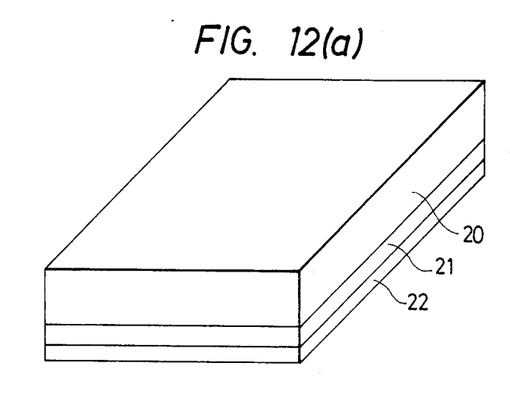
FIGS. 12(a) to 12(d) are explanatory perspective views of the steps of supplying wrought solder.
Figure 12B:
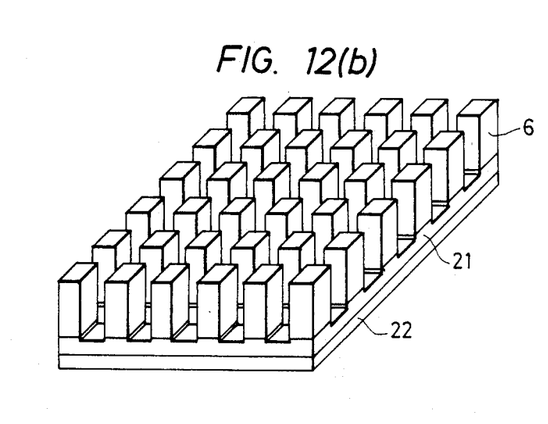
Figure 12C:
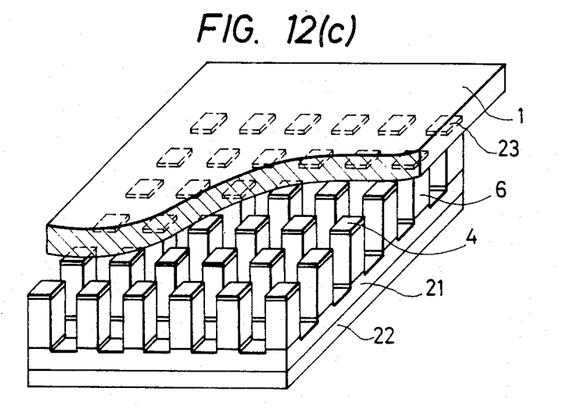
Figure 12D:
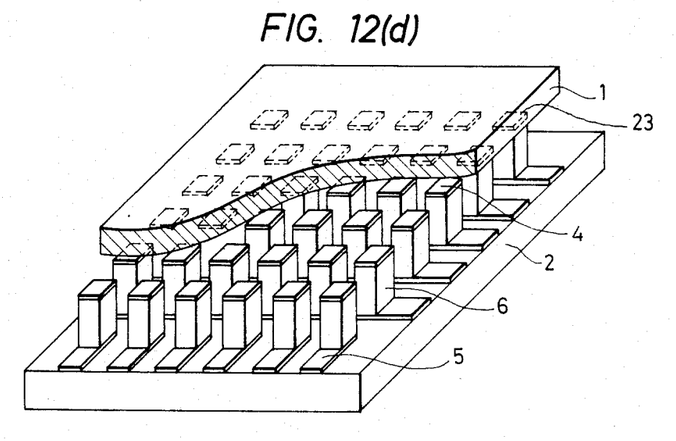

When several hundreds of electrodes measuring several hundred $\mu m$ in diameter are necessary, as in connecting IC of LSI, some problems have been experienced in terms of the method of supplying solder which have been worked in accordance with the electrodes and subjected to heat treatment. According to the invention, a wrought solder sheet 20 is first reinforced with lined hardening flux 21 (which hardens at a temperature of not higher than 100° C.) before they are fixed on a glass sheet 22 or the like, as shown in FIG. 12(a), in order to prevent the electrodes from being disconnected by minute working. The hardening flux 21 used here can be easily removed when desired. The reinforcing material may be solder which has a lower-melting-point than that of the solder sheet 21, and which is plated, deposited or clad by rolling. The solder sheet 20 is next cut and divided at a pitch of several hundred μm into a multiplicity of solder pillars 6 with a wire saw or by electric spark machining, as shown in FIG. 12(b), and the hardening flux beneath the solder sheet 20 is cut downward to an intermediate point in its depth, whereto each solder pillar 6 is fixed. Thereafter, as is shown in FIG. 12(c), the end portion of each solder pillar 6 is brought into contact with a low-melting-point solder 23 such as eutectic solder which has been supplied to the opposing end surface of the part or the semiconductor chip 1 by dipping or the like. In this way, only the low-melting-point solder 23 is melted and all the electrodes and the parts are thereby securely connected. After the hardening flux 21 is removed by dissolving it with solvent such as isopropyl alcohol or trichloroethylene, the part or the semiconductor chip 1 is connected with the circuit substrate 2 by low-meltihg point solder (not shown). Thus the part and the circuit substrate 2 are connected without dissolving the multiplicity of fine solder joints one by one. The method of supplying solder described above is efficient in mass productivity because solder can be supplied not only to each part, but also to the entire surface of, for example, Si wafer, with all electrodes worked collectively.

Figure 13:
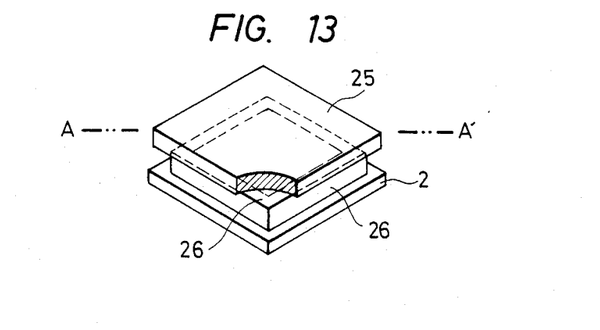
FIG. 13 is a perspective view of still another embodiment of an electronic circuit device according to the invention.
Figure 14:
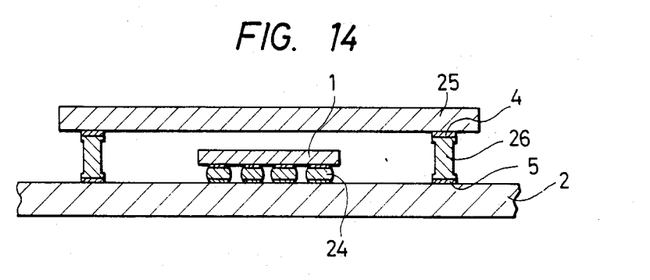
FIG. 14 is a sectional view of the device shown in FIG. 13, taken along the line A—A'.

An embodiment of the invention which is applied to sealing in an electronic circuit device will next be explained with reference to FIGS. 13 and 14. As is shown in FIGS. 13 and 14, in order to seal the semiconductor chip 1 or the part such as a condenser, which is connected with the substrate with solder 24, on the circuit substrate 2, wrought solder 26 is inserted between a cover 25 which covers the portion above the semiconductor chip 1 or a part such as a condenser and the peripheral end portions of the circuit substrate 2 through the electrodes 4 and 5. Solder (not shown) having a lower-melting point than the wrought solder 26 is inserted between the electrodes 4 and 5 and the wrought solder 26, and only the low-melting-point solder is melted, whereby the cover 25 and the circuit substrate 2 are connected by local melting. The interior sealed by the cover 25, the wrought solder 26 and the circuit substrate 2 is a vacuum or an inert gas atmosphere which chemically protects the part. High-melting-point solder is used as the solder 24 for connecting the semiconductor chip 1 or the part such as a condenser with the circuit substrate 2, so as not to be melted when sealing the cover 25 and the circuit substrate 2. The method of manufacturing the electronic circuit device in this case is the same as that shown in FIG. 9.

As described above, this invention enables connection and sealing of semiconductors and electronic circuit parts using wrought solder which has softness, good ductility and fatigue property. Accordingly, a highly reliable electronic circuit device can be obtained with a simple construction and easy operation. Thus this invention can greatly improve the field of surface mounting in which higher reliability and higher density will be increasingly required, for example, it can contribute to upgrading of the functions of an electronic circuit device such as a computer.

What is claimed is:

1. An electronic circuit device comprising:
    a substrate;
    an assembly mounted on said substrate; and
    solder for connecting said assembly to said substrate;
    said solder being composed of low-melting-point solder portions and a high-melting-point solder portion subjected to working and heat treatment; and
    said high-melting-point solder portion being connected to both of said substrate and said assembly through said low-melting-point solder portions.

2. An electronic circuit device according to claim 1, wherein said assembly is an electronic circuit part and said substrate is an electronic circuit substrate.

3. An electronic circuit device according to claim 1, wherein said assembly is a semiconductor chip and said substrate is an electronic circuit substrate to which said semiconductor chip is to be mounted.

4. An electronic circuit device according to claim 1, wherein an electronic circuit part is mounted on said electronic circuit substrate and connected to said substrate with first solder;
    a cover for covering said electronic circuit part is connected to said electronic circuit substrate with second solder; and
    at least one of said first and second solders is composed of a high-melting-point solder portion which is subjected to working and heat treatment, and low-melting-point solder portions.

5. In a method of connecting a substrate and an assembly which is mounted on said substrate and is to be connected thereto with solder, a method of manufacturing an electronic circuit device comprising the steps of:
    preparing solder composed of a low-melting-point solder portion and a high-melting-point solder portion subjected to working and heat treatment;
    inserting said low-melting-point solder portions between predetermined positions of said high-melting-point solder portion and predetermined positions of objects to be connected; and
    connecting said high-melting-point solder portion to said objects to be connected by melting said low-melting-point solder portions.

6. A method of manufacturing an electronic circuit device according to claim 5, wherein said step of inserting said low-melting-point solder portions between the predetermined positions of said high-melting-point solder portion and the predetermined positions of said objects to be connected is carried out by fusion bonding, in advance, said low-melting-point solder portions at said predetermined positions of said high-melting-point solder portion.

7. A method of manufacturing an electronic circuit device according to claim 5, wherein said step of inserting said low-melting-point solder portions between the predetermined positions of said high-melting-point solder portion and the predetermined positions of said objects to be connected is carried out by fusion bonding, in advance, said low-melting-point solder portions at said predetermined positions of said objects to be connected.

8. A method of manufacturing an electronic circuit device according to claim 5, wherein said assembly is an electronic circuit part and said substrate is an electronic circuit substrate; said method including the steps of inserting said low-melting-point solder portions between said high-melting-point solder portion and said electronic circuit part and between said high-melting-point solder portion and said electronic circuit substrate, and connecting said circuit part and said circuit substrate by heating said solder at a temperature which is lower than the melting temperature of said high-melting-point solder and allows said low-melting-point solder portions to be melted.

9. A method of manufacturing an electronic circuit device according to claim 5, wherein said substrate is an electronic circuit substrate and said assembly is a cover for covering an electronic circuit part which is mounted on said electronic circuit substrate and is to be connected thereto; said method including the steps of inserting said low-melting-point solder portions between said high-melting-point solder portion and said cover and between said high-melting-point solder portion and said electronic circuit substrate, and connecting said cover and said circuit substrate by heating said solder at a temperature which is lower than the melting temperature of said high-melting-point solder and allows said low-melting-point solder portions to be melted.

10. A method of manufacturing an electronic circuit device according to claim 5, said method including the steps of:
  forming said high-melting-point solder into a sheet and reinforcing one end surface thereof with a reinforcing sheet which melts at a lower temperature than said high-melting-point solder;
  cutting a groove into the reinforced solder from said high-melting-point solder through said high-melting-point solder portion to an intermediate point of said plate; and
  connecting an object to be connected and said high-melting-point solder portion with low-melting-point solder which is attached to said end surface of said high-melting-point solder portion.

11. A method of manufacturing an electronic circuit device according to claim 5, said method including the steps of:
  forming said high-melting-point solder into a sheet and reinforcing one end surface thereof with a reinforcing sheet which melts at a lower temperature than said high-melting-point solder;
  cutting a groove into the reinforced solder from said high-melting-point solder through said high-melting-point solder portion to an intermediate point of said plate;
  connecting a first object to be connected and said high-melting-point solder portion with low-melting-point solder which is attached to said end surface of said high-melting-point solder portion;
  removing said reinforcing sheet; and
  connecting a second object to be connected and the high-melting-point solder portion which is left by the removal of said reinforcing plate with low-melting-point solder which is attached to the other end surface of said high-melting-point solder portion.

12. A method of manufacturing an electronic circuit device according to claim 5, wherein, when said substrate is connected to an electronic circuit assembly, said high-melting-point solder is supplied to a predetermined position between said substrate and said electronic circuit assembly by using a mask with holes formed in correspondence with the pattern of conductors of said electronic circuit assembly.

* * * * *